(12) United States Patent
Tonegawa et al.

(10) Patent No.: US 10,535,501 B2
(45) Date of Patent: Jan. 14, 2020

(54) FILM FORMING APPARATUS, FILM FORMING METHOD AND NON-TRANSITORY STORAGE MEDIUM

(71) Applicant: TOKYO ELECTRON LIMITED, Tokyo (JP)

(72) Inventors: Yamato Tonegawa, Nirasaki (JP); Katsutoshi Ishii, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 377 days.

(21) Appl. No.: 14/290,233

(22) Filed: May 29, 2014

(65) Prior Publication Data
US 2014/0356550 A1 Dec. 4, 2014

(30) Foreign Application Priority Data
May 31, 2013 (JP) .................................. 2013-115790

(51) Int. Cl.
*H01J 37/32* (2006.01)
(52) U.S. Cl.
CPC .............................. *H01J 37/3244* (2013.01)
(58) Field of Classification Search
CPC ............ H01J 37/3244; H01J 37/32834; C23C 16/45536; C23C 16/4412; C23C 16/345
See application file for complete search history.

(56) References Cited

U.S. PATENT DOCUMENTS

| | | | | |
|---|---|---|---|---|
| 5,365,772 A | * | 11/1994 | Ueda | G01M 3/226 117/86 |
| 5,484,484 A | * | 1/1996 | Yamaga | C23C 16/345 118/715 |
| 6,382,249 B1 | * | 5/2002 | Kawasaki | C23C 16/4412 118/50 |
| 8,426,117 B2 | | 4/2013 | Hasebe | |
| 2008/0145533 A1 | * | 6/2008 | Honda | C23C 16/405 427/248.1 |

(Continued)

FOREIGN PATENT DOCUMENTS

| JP | 2001-220677 A | 8/2001 |
|---|---|---|
| JP | 2004-183096 A | 7/2004 |

(Continued)

*Primary Examiner* — Kambiz Zand
*Assistant Examiner* — Mirza Israr Javed
(74) *Attorney, Agent, or Firm* — Nath, Goldberg & Meyer; Jerald L. Meyer

(57) ABSTRACT

A film forming apparatus includes a first supply unit configured to supply a first reaction gas into the reaction vessel under an environment of a first pressure, a second supply unit configured to supply a second reaction gas into the reaction vessel under an environment of a second pressure lower than the first pressure, a first vacuum exhaust mechanism connected to the reaction vessel through a first exhaust path in order to create the environment of the first pressure within the reaction vessel, a second vacuum exhaust mechanism connected to the reaction vessel through a second exhaust path in order to create the environment of the second pressure, the second vacuum exhaust mechanism being lower in an operation pressure zone than the first vacuum exhaust mechanism, and a switching unit configured to switch exhaust destinations of the reaction vessel between the first path and the second path.

11 Claims, 13 Drawing Sheets

(56) References Cited

U.S. PATENT DOCUMENTS

2010/0081094 A1* 4/2010 Hasebe .................. C23C 16/02
430/323

FOREIGN PATENT DOCUMENTS

| JP | 2005-064306 A | 3/2005 |
|----|---------------|--------|
| JP | 2005-506446 A | 3/2005 |
| JP | 2006-32610 A | 2/2006 |
| JP | 2006-520433 A | 9/2006 |
| JP | 4242733 B2 | 1/2009 |
| JP | 2010-118441 A | 5/2010 |
| TW | 478098 | 11/1989 |
| TW | 1278023 | 1/1995 |
| WO | 0133618 A1 | 5/2001 |

* cited by examiner

FILM FORMING APPARATUS, FILM FORMING METHOD AND NON-TRANSITORY STORAGE MEDIUM

CROSS-REFERENCE TO RELATED APPLICATION

This application claims the benefit of Japanese Patent Application No. 2013-115790, filed on May 31, 2013, in the Japan Patent Office, the disclosure of which is incorporated herein in its entirety by reference.

TECHNICAL FIELD

The present disclosure relates to a technology of evacuating the interior of a reaction vessel in which a film forming process is performed.

BACKGROUND

As a method of forming a film on a substrate, e.g., a semiconductor wafer (hereinafter referred to as a "wafer"), there is known a method called an ALD (Atomic Layer Deposition) method or an MLD (Multi Layer Deposition) method (which will be collectively referred to as an ALD method), in which a reaction product is deposited by sequentially supplying different kinds of reaction gases reacting with one another to a wafer.

In the ALD method, the internal pressure of a reaction vessel may be changed depending on the kinds of reaction gases supplied to a wafer. For example, if the internal pressure of the reaction vessel is adjusted using a common vacuum exhaust mechanism installed in an exhaust pipe of the reaction vessel, the pressure range may be changed but is restricted by the capacity of the vacuum exhaust mechanism. Thus, depending on the kinds of reaction gases used, it is sometimes impossible to realize an optimal pressure environment.

In the related art, there is available a semiconductor manufacturing apparatus configured to form a SiN (silicon nitride) film by an ALD method. In order to prevent byproducts from being deposited within a vacuum exhaust system, which may be caused by the mixture of two kinds of gases, the semiconductor manufacturing apparatus employs a structure in which an exhaust pipe for an ammonia gas and an exhaust pipe for dichlorosilane (DCS: $SiH_2Cl_2$) are installed independently from each other and vacuum pumps are installed in the respective exhaust pipes.

In the semiconductor manufacturing apparatus, an inert gas is supplied when switching the exhaust pipes for the ammonia gas and the DCS gas. The exhaust pipes are switched during the supply of the inert gas. When the exhaust pipes for the ammonia gas and the DCS gas are to be switched, a time period is set so that the inert gas can flow through the exhaust pipes for both the ammonia gas and the DCS gas in parallel during the set time period.

The related art remains silent on the capacity of the vacuum pumps installed in both exhaust pipes in the semiconductor manufacturing apparatus. However, the parallel flow of the inert gas through the two exhaust pipes means that little pressure difference exists between the exhaust pipes and that a gas backflow problem does not exist. In view of this fact, it can be noted that the vacuum pumps installed in the exhaust pipes have the same capacity. Therefore, even if the exhaust pipes are switched depending on the kinds of the reaction gases supplied to a wafer-accommodating process furnace, the range of the internal pressure of the process furnace remains the same as a case where a single vacuum pump is used.

SUMMARY

Some embodiments of the present disclosure provide to a film forming apparatus capable of flexibly changing an internal pressure of a reaction vessel depending on the kinds of reaction gases supplied to the reaction vessel, a film forming method and a storage medium which stores the film forming method.

According to the embodiment of the present disclosure, provided is a film forming apparatus configured to perform a film forming process on a substrate in a vacuum environment by sequentially supplying different kinds of mutually-reacting reaction gases into a reaction vessel, including a first reaction gas supply unit configured to supply a first reaction gas into the reaction vessel under an environment of a first pressure, a second reaction gas supply unit configured to supply a second reaction gas into the reaction vessel under an environment of a second pressure lower than the first pressure, a first vacuum exhaust mechanism connected to the reaction vessel through a first exhaust path in order to create the environment of the first pressure within the reaction vessel, a second vacuum exhaust mechanism connected to the reaction vessel through a second exhaust path in order to create the environment of the second pressure within the reaction vessel, the second vacuum exhaust mechanism being lower in an operation pressure zone than the first vacuum exhaust mechanism, and a switching unit configured to switch exhaust destinations of the reaction vessel between the first exhaust path and the second exhaust path.

According to the embodiment of the present disclosure, provided is a film forming method for performing a film forming process on a substrate in a vacuum environment by sequentially supplying different kinds of mutually-reacting reaction gases into a reaction vessel, including a first process in which a first reaction gas is supplied into the reaction vessel under an environment of a first pressure and in which the interior of the reaction vessel is evacuated by a first vacuum exhaust mechanism connected to the reaction vessel through a first exhaust path in order to create the environment of the first pressure within the reaction vessel, and a second process in which a second reaction gas is supplied into the reaction vessel under an environment of a second pressure lower than the first pressure and in which the interior of the reaction vessel is evacuated by a second vacuum exhaust mechanism connected to the reaction vessel through a second exhaust path and lower in an operation pressure zone than the first vacuum exhaust mechanism in order to create the environment of the second pressure within the reaction vessel, wherein the first process and the second process are repeatedly performed.

According to the embodiment of the present disclosure, provided is a non-transitory computer-readable storage medium for storing a computer program used in a film forming apparatus configured to perform a film forming process on a substrate in a vacuum environment by sequentially supplying different kinds of mutually-reacting reaction gases into a reaction vessel, the computer program incorporating a process group for implementing the above film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
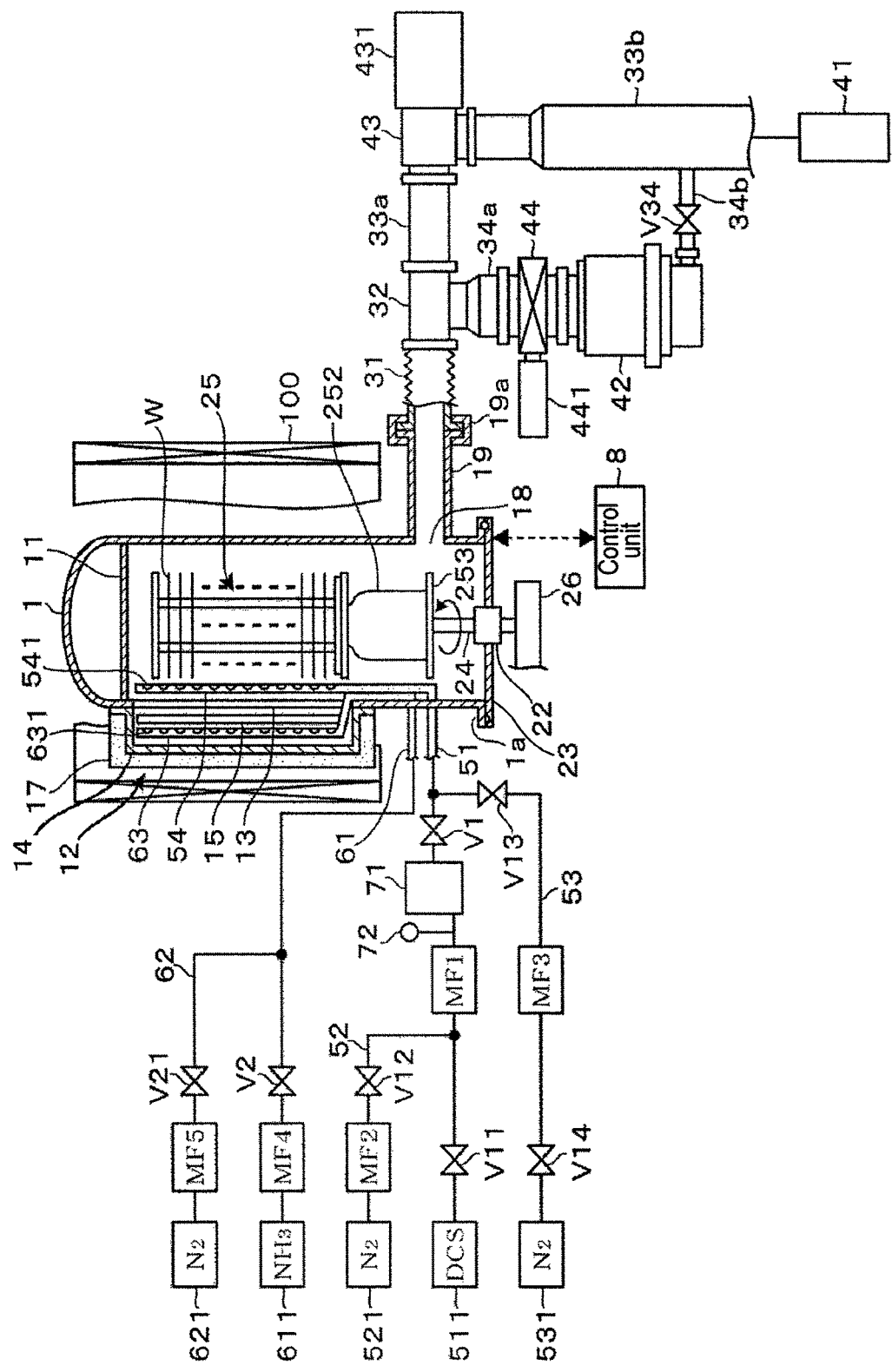
FIG. 1 is a configuration diagram of a film forming apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As one example of a film forming apparatus according to an embodiment of the present disclosure, an ALD film forming process will be described. In the ALD film forming process, a SiN (silicon nitride) film as a reaction product is formed by sequentially supplying an ammonia gas and a DCS (dichlorosilane) gas as reaction gases to a wafer W.

In the present film forming process, an ammonia gas is converted to plasma and is supplied to the surface of a wafer W in the form of active species such as $NH_2$ radicals or the like, thereby increasing the reactivity with the DCS gas. The active species such as radials or the like have a short lifespan. Therefore, along with the increase in the size of the wafer or the increase in the surface area of the wafer attributable to the miniaturization of patterns, it is often difficult to supply a sufficient amount of active species to the central region of the wafer W. If the amount of the active species supplied to the wafer W becomes different between the central portion and the peripheral edge portion of the wafer W, the in-plane uniformity of the thickness of the film gets lowered. Under the circumstances, the present inventors have found that, if the internal pressure of a reaction vessel 1 is reduced during the supply of an ammonia gas, it is possible to reduce the probability of collision of the active species and to prolong the lifespan of the active species (see test examples to be described later).

When the DCS gas is supplied into the reaction vessel 1 without going through an activation process such as plasma conversion or the like, DCS molecules are adsorbed to or deposited on the entire surface of the wafer W within a relatively short period of time (In the following description, adsorption and deposition will be collectively referred to as "attachment"). For that reason, the internal pressure of the reaction vessel 1 during the supply of the DCS gas becomes higher than the internal pressure of the reaction vessel 1 during the supply of the ammonia gas. The film forming apparatus of the present embodiment evacuates the interior of the reaction vessel 1 through the use of different exhaust paths depending on the kinds of reaction gases supplied so that an optimal pressure environment can be formed within the reaction vessel 1. The configuration of the film forming apparatus will now be described with reference to FIGS. 1 and 2.

As shown in FIG. 1, the film forming apparatus of the present embodiment includes a cylindrical reaction vessel 1 having a roof and an open lower end. The reaction vessel 1 is made of, e.g., quartz. The roof-side end of the interior of the reaction vessel 1 is sealed by a quartz-made ceiling plate 11. A flange portion 1a is formed in the opening portion of the lower end portion of the reaction vessel 1. A stainless steel-made manifold may be formed in the lower end portion of the reaction vessel 1.

Figure 2:
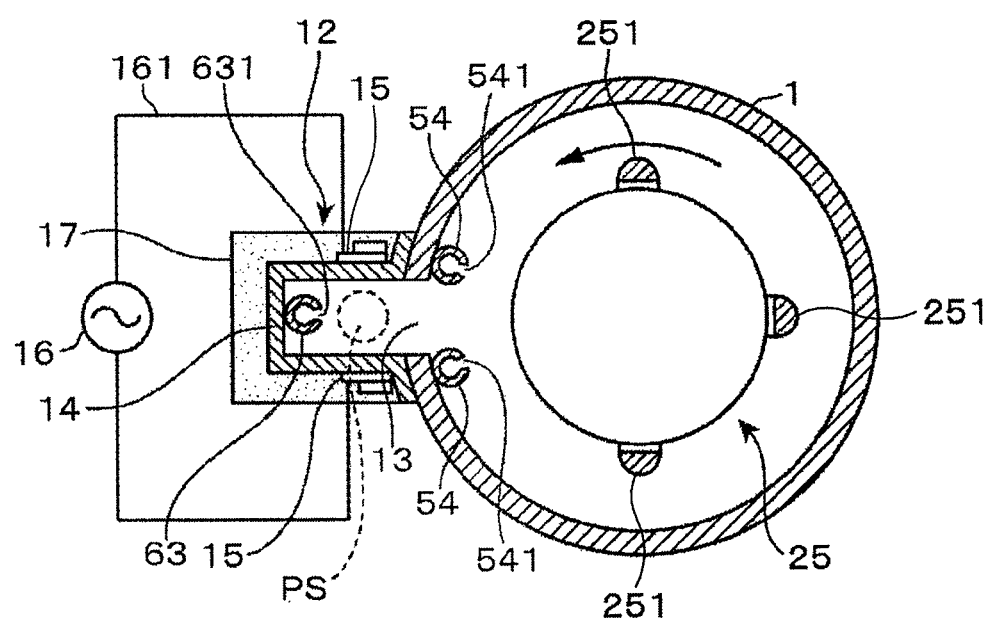
FIG. 2 is a horizontal sectional plan view of a reaction vessel installed in the film forming apparatus.
Figure 3:
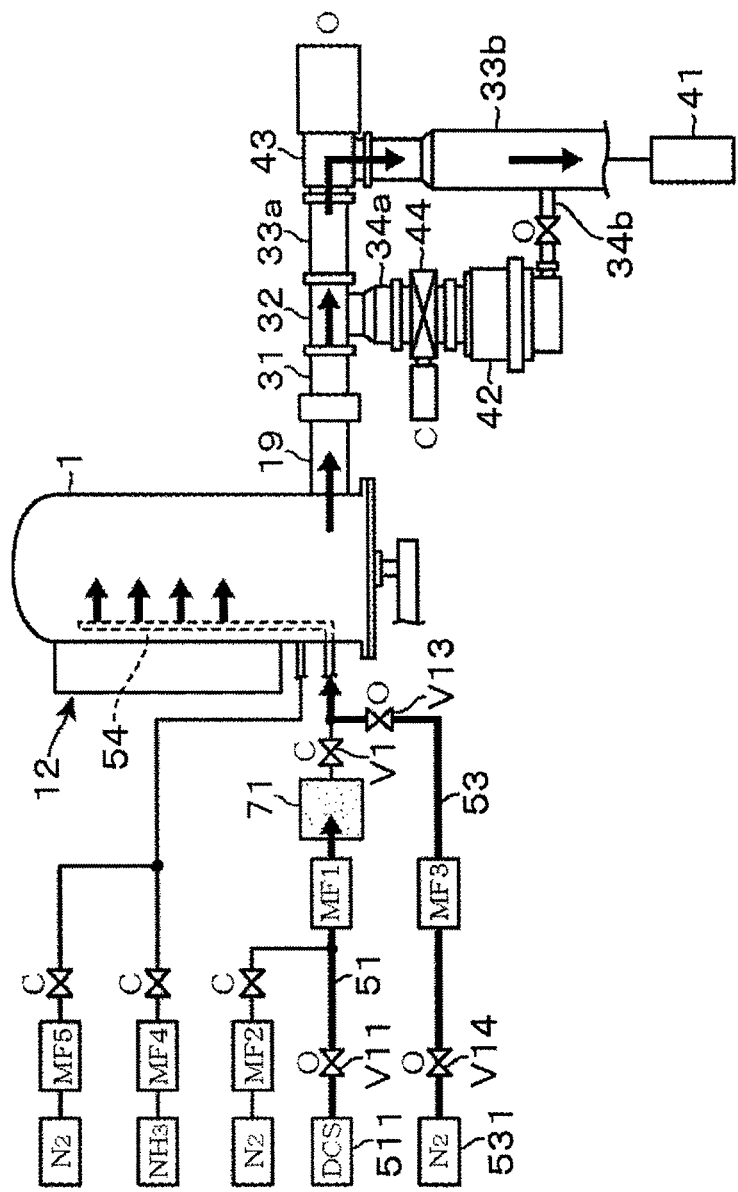
FIG. 3 is a first operation view of the film forming apparatus.

A wafer boat 25 as a substrate holding unit for holding a plurality of wafers W in a shelf-like shape is carried in and out through the opening portion of the lower end portion of the reaction vessel 1. As shown in FIGS. 1 and 2, the wafer boat 25 includes, e.g., three posts 251 and supports the outer edge portions of the wafers W. The wafer boat 25 can hold a plurality of, e.g., 125, wafers W in a shelf-like shape.

The wafer boat 25 is mounted on a table 253 through a quartz-made heat insulating mold 252. The table 253 is supported on a rotating shaft 24 which extends through a lid 23 made of stainless steel. If the wafer boat 25 is carried into the reaction vessel 1 through the opening portion and is moved up to a specified height, the opening portion is hermetically sealed by the lid 23.

A bearing unit 22 provided with, e.g., a magnetic fluid seal, and configured to rotatably hold the rotating shaft 24 while keeping the interior of the reaction vessel 1 hermetically sealed is installed in a position where the rotating shaft 24 passes through the lid 23. For example, an O-ring is interposed between the peripheral portion of the lid 23 and the flange portion 1a of the reaction vessel 1 to keep the interior of the reaction vessel 1 hermetically sealed.

The rotating shaft 24 is installed at the distal end of an arm 26 which is supported on a lift mechanism (not shown) such as a boat elevator or the like. The wafer boat 25 and the lid 23 can be moved up and down as a unit and can be carried into and out of the reaction vessel 1.

A plasma generating unit 12 is installed in a portion of the sidewall of the reaction vessel 1. The plasma generating unit 12 is configured by hermetically bonding a partition wall 14 having a concave cross section and made of, e.g., quartz, to the outer wall of the reaction vessel 1 so as to cover a vertically elongated opening 13 formed in the sidewall of the reaction vessel 1. The opening 13 is vertically elongated so as to cover all the wafers W supported on the wafer boat 25.

A pair of mutually-facing plasma electrodes 15 is installed on the outer surfaces of the opposite side walls of the partition wall 14 so as to extend along the longitudinal direction thereof (along the up-down direction). A plasma-generating high-frequency power supply 16 is connected to the plasma electrodes 15 through a power supply line 161. By applying a high-frequency voltage of, e.g., 13.56 MHz, to the plasma electrodes 15, plasma is generated. An insulating protection cover 17 made of, e.g., quartz, is installed at the outside of the partition wall 14 so as to cover the partition wall 14. The plasma generating unit 12 corresponds to a gas activation unit of the present embodiment.

A DCS supply path 51 for supplying a silane-based gas, e.g., a DCS gas, is inserted through the lower portion of the reaction vessel 1. For example, two first gas nozzles 54 are installed in the tip end portion of the DCS supply path 51 so as to extend upward within the reaction vessel 1. The first gas nozzles 54 are formed from quartz tubes. As shown in FIG. 2, the first gas nozzles 54 are disposed at the opposite sides of the opening 13 of the plasma generating unit 12. In the first gas nozzles 54, a plurality of gas ejection holes 541 is formed at a specified interval along the longitudinal direction of each of the first gas nozzles 54. The DCS gas corresponds to a first reaction gas of the present embodiment.

An ammonia supply path 61 for supplying an ammonia gas is inserted through the lower portion of the reaction vessel 1. A second gas nozzle 63 formed from a quartz tube is installed in the tip end portion of the ammonia supply path 61. As shown in FIGS. 1 and 2, the second gas nozzle 63 extends upward within the reaction vessel 1. The second gas nozzle 63 is bent in the intermediate portion thereof and is arranged within the plasma generating unit 12. A plurality of gas ejection holes 631 is formed at a specified interval along the longitudinal direction of the second gas nozzle 63. The ammonia gas corresponds to a second reaction gas of the present embodiment. In FIG. 1, for the sake of convenience in illustration, the respective gas nozzles 54 and 63 are illustrated as if they are inserted into the reaction vessel 1 through the lower sidewall of the reaction vessel 1. However, in reality, the respective gas nozzles 54 and 63 are inserted through the flange portion 1*a*.

The base end portion of the DCS supply path 51 connected to the first gas nozzles 54 are connected to a DCS supply unit 511. In the DCS supply path 51, a valve V1, a retaining tank 71, a pressure detecting unit 72, a flow rate control unit MF1 and a valve V11 are installed in the named order from the side of the reaction vessel 1. The DCS supply path 51 is branched between the flow rate control unit MF1 and the valve V11 and is connected to a supply source 521 for a nitrogen gas as a purge gas through a purge gas supply path 52 provided with a valve V12 and a flow rate control unit MF2.

The DCS supply path 51 is branched at the downstream side of the valve V1 and is connected to a supply source 531 for a nitrogen gas as a substituting gas through a substituting gas supply path 53. In the substituting gas supply path 53, a valve V13, a flow rate control unit MF3 and a valve V14 are installed in the named order from the side of the reaction vessel 1. The nitrogen gas supplied from the substituting gas supply path 53 is also used as a carrier gas for the DCS gas which is supplied from the DCS supply path 51 to the first gas nozzles 54. The respective valves described above are configured to perform the supply and stop supplying gases. The respective flow rate control units are configured to control of the amount of gas supplied to the respective valves. This holds true with respect to the valves and the flow rate control units to be described later.

The retaining tank 71 is configured such that the DCS gas is retained within the retaining tank 71 when closing the valve V1 installed at the downstream side thereof and supplying the DCS gas to the retaining tank 71. Also, the retaining tank 71 may control the internal pressure of the retaining tank 71 to increase by continuously supplying the DCS gas. The retaining tank 71 is made of, e.g., stainless steel. The retaining tank 71 used herein has a pressure resistance of, e.g., 93.3 kPa, and an internal volume of, e.g., about 1 litter.

The base end portion of the ammonia supply path 61 connected to the second gas nozzle 63 is connected to an ammonia gas supply unit 611. In the ammonia supply path 61, a valve V2 and a flow rate control unit MF4 are installed in the named order from the side of the reaction vessel 1. The ammonia supply path 61 is branched at the downstream side of the valve V2 and is connected to a supply source 621 for a nitrogen gas as a substituting gas through a substituting gas supply path 62 provided with a valve V21 and a flow rate control unit MF5. The nitrogen gas supplied from the substituting gas supply path 62 is also used as a carrier gas for the ammonia gas which is supplied from the ammonia supply path 61 to the second gas nozzle 63.

The first gas nozzles 54, the DCS supply path 51 and the DCS supply unit 511 described above correspond to a first reaction gas supply unit of the present embodiment. The second gas nozzle 63, the ammonia supply path 61 and the ammonia gas supply unit 611 described above correspond to a second reaction gas supply unit.

As shown in FIG. 1, a tubular heater 100 is installed around the reaction vessel 1 so as to surround the lateral circumferential surface of the reaction vessel 1 from the outside thereof. The heater 100 serves to heat the wafers W existing within the reaction vessel 1 to a temperature range of from 300 to 800 degrees C., e.g., 500 degrees C.

In the film forming apparatus of the present embodiment configured as above, the gas existing within the reaction vessel 1 is exhausted through different exhaust paths in order to create specified pressure environments within the reaction vessel 1 during the supply of the ammonia gas and during the supply of the DCS gas. The configurations of the exhaust paths will be described in detail below.

As shown in FIG. 1, on the lower sidewall surface of the reaction vessel 1, an exhaust hole 18 is formed in a position lower than the wafer boat 25 that supports the wafers W within the reaction vessel 1. An exhaust port 19 made of, e.g., quartz, and configured to exhaust the gas existing within the reaction vessel 1 extends from the exhaust hole 18 in the horizontal direction.

A flange portion is formed in the tip end portion of the exhaust port 19. The flange portion is brought into contact with a flange portion of a common exhaust pipe 31 through a seal member not shown. The flange portions of the exhaust port 19 and the common exhaust pipe 31 making contact with each other are fastened by a ring-shaped cover member 19*a*, whereby the exhaust port 19 and the common exhaust pipe 31 are connected to each other. The common exhaust pipe 31 includes, e.g., a bellows-shaped portion which can be expanded and contracted and can be flexed. Thus, the common exhaust pipe 31 reduces the stresses applied to the quartz-made exhaust port 19.

The common exhaust pipe 31 is connected to first exhaust pipes 33*a* and 33*b* through a branch pipe 32 and is connected at the downstream side of the first exhaust pipes 33*a* and 33*b* to a dry pump 41 as a vacuum pump which is a first vacuum exhaust mechanism. The dry pump 41 has an ability to reduce the internal pressure of the reaction vessel 1 to 13.3 Pa (0.1 Torr) or less when an inert gas (e.g., a nitrogen gas) is supplied into the reaction vessel 1 at 1 slm (under the standard conditions of 0 degrees C. and 1 atm). A detoxifying facility (not shown) is arranged at the rear end of the dry pump 41. An exhaust gas is treated by the detoxifying facility.

A first switching valve 43 is installed between the first exhaust pipes 33a and 33b which are disposed in an orthogonal relationship with each other. A valve body existing within the first switching valve 43 is driven by a drive unit 431, thereby connecting and disconnecting the upstream exhaust pipe 33a and the downstream exhaust pipe 33b. The first switching valve 43 can change the opening degree thereof by changing the angle of the valve body. This makes it possible to adjust the exhaust amount. The first exhaust pipes 33a and 33b existing at the downstream side of the branch pipe 32 constitute a first exhaust path of the present embodiment.

A second exhaust pipe 34a is branched from the branch pipe 32. The downstream side of the second exhaust pipe 34a is connected to the second exhaust pipe 34b through a second switching valve 44, a turbo molecular pump (TMP) 42 and a valve V34. The second exhaust pipe 34b is joined at the downstream side thereof to the first exhaust pipe 33b described above.

The second switching valve 44 is formed from a butterfly valve. A valve body existing within the butterfly valve is driven by a drive unit 441, thereby connecting and disconnecting the second exhaust pipe 34a and the intake portion of the TMP 42. The TMP 42 is installed to further reduce the internal pressure of the reaction vessel 1 which has been evacuated by the dry pump 41 described above. For example, the TMP 42 has an ability to reduce the internal pressure of the reaction vessel 1 to 6.7 Pa (0.05 Torr) or less under a condition in which an inert gas is supplied into the reaction vessel 1 at 1 slm.

In general, the TMP 42 has a limit in its lifting power and is therefore used in combination with another vacuum pump. In the present embodiment, the TMP 42 is used in combination with the dry pump 41 described above. From this viewpoint, the TMP 42 and the dry pump 41 used in combination with the TMP 42 correspond to a second vacuum exhaust mechanism. The second exhaust pipe 34a branched off from the branch pipe 32, the TMP 42, the second exhaust pipe 34b and the portion of the first exhaust pipe 33b existing at the downstream side of the joining position of the second exhaust pipe 34b constitute a second exhaust path of the present embodiment. The first switching valve 43 and the second switching valve 44 correspond to a switching unit that switches the exhaust destination of the gas existing within the reaction vessel 1 between the first exhaust path (the first exhaust pipes 33a and 33b) and the second exhaust path (the second exhaust pipe 34a, the TMP 42 and the second exhaust pipe 34b).

The film forming apparatus having the configuration described above is connected to a control unit 8 as shown in FIG. 1. The control unit 8 may be a computer which includes a CPU and a storage unit not shown. The storage unit stores a program that incorporates a step (command) group regarding the operation of the film forming apparatus of the present embodiment, namely the operation of forming a SiN film by carrying the wafers W held on the wafer boat 25 into the reaction vessel 1 and then sequentially supplying the DCS gas and the ammonia gas while switching the exhaust destination of the gas existing within the reaction vessel 1. The program is stored in a storage medium such as a hard disc, a compact disc, a magneto-optical disc or a memory card and is installed on the computer from the storage medium.

Next, the operation of the film forming apparatus of the present embodiment will be described with reference to FIGS. 3 to 8. In these figures, the heater 100, the wafer boat 25 and the gas nozzles 54 and 63 not in use are omitted as appropriate. The "open" state of the respective switching valves 43 and 44 and the valves is designated by symbol "O" and the "closed" state thereof is designated by symbol "C".

Initially, the wafers W as workpieces to be processed are loaded into the wafer boat 25. Then, the arm 26 is move upward to carry the wafer boat 25 into the reaction vessel 1. The reaction vessel 1 is hermetically closed by the lid 23. At this time, at the exhaust side of the reaction vessel 1, the first switching valve 43 is "opened" and the second switching valve 44 is "closed" such that the gas existing within the reaction vessel 1 is discharged toward the dry pump 41 through the first exhaust path (the first exhaust pipes 33a and 33b).

A pressure-regulating nitrogen gas is supplied from, e.g., the nitrogen gas supply source 531, to the reaction vessel 1 through the first gas nozzles 54. The internal pressure of the reaction vessel 1 is regulated to a range of from 13.3 to 133 Pa (from 0.1 to 1.0 Torr), e.g., 53.3 Pa (0.4 Torr). In reality, a nitrogen gas is also supplied from the nitrogen gas supply source 621 through the second gas nozzle 63 while not shown for the sake of convenience (In FIGS. 4 to 8, a nitrogen gas is supplied from the nozzles 54 and 63 not shown into the reaction vessel 1).

At this time, the valve V1 of the DCS supply path 51 is closed to disconnect the DCS supply path 51 from the first gas nozzles 54. The valve V11 is opened to supply a DCS gas from the DCS supply unit 511 into the retaining tank 71, which then will retain the DCS gas. If a specified amount of the DCS gas is retained in the retaining tank 71 and if the internal pressure of the retaining tank 71 is increased to a range of from 33.3 to 53.3 kPa (from 250 to 400 Torr), the supply of the DCS gas to the retaining tank 71 is stopped.

Figure 4:
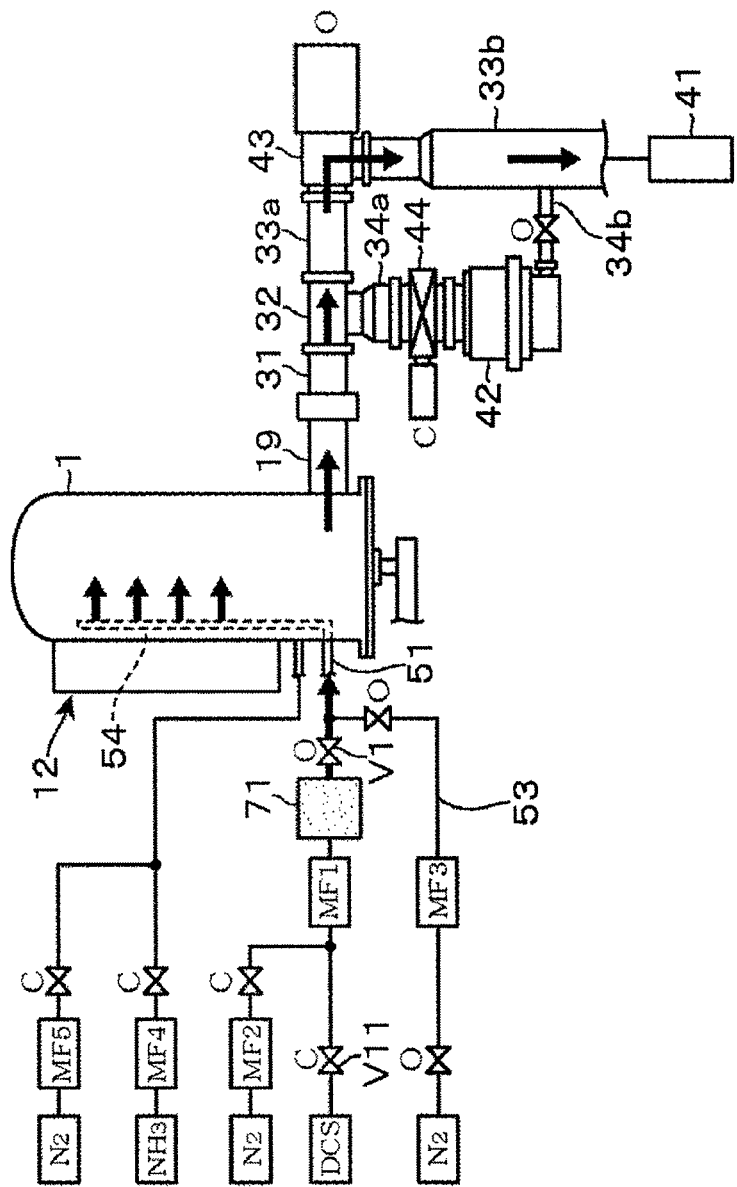
FIG. 4 is a second operation view of the film forming apparatus.

Then, the valve V1 is opened such that the DCS gas is ejected from the retaining tank 71 toward the first gas nozzles 54 (see FIG. 4). As described above, the internal pressure of the reaction vessel 1 has already been regulated to 53.3 Pa (0.4 Torr). Therefore, if the valve V1 is opened, the DCS gas is vigorously discharged from the retaining tank 71 and is ejected into the reaction vessel 1 through the ejection holes 541 of the first gas nozzles 54. At this time, a nitrogen gas as a carrier gas is supplied from the substituting gas supply path 53. In order to increase the probability of attachment of the DCS gas to the wafers W, the first switching valve 43 may completely be "closed" or slightly "opened" by adjusting the valve angle of the first switching valve 43.

In the present embodiment, the retaining amount and the pressure of the DCS gas within the retaining tank 71 is set so that the internal pressure of the reaction vessel 1 can be increased to a range of from 13.3 to 665 Pa (from 0.1 to 5.0 Torr), e.g., 440 Pa (3.3 Torr), within about 3 seconds. The DCS gas supplied into the reaction vessel 1 is passed across and attached to the surfaces of the wafers W held on the rotating wafer boat 25 and heated by the heater 100. The DCS gas not attached is exhausted through the exhaust hole 18. The internal pressure of the reaction vessel 1 is returned to the original pressure (53.3 Pa (0.4 Torr)) within about 1 second.

In this way, a relatively large amount of the DCS gas is supplied within a short period of time, whereby DCS molecules can be uniformly attached to the surfaces of the wafers W. Although not shown in FIG. 4, a step of supplying the DCS gas (the first reaction gas) while exhausting the DCS gas to the first exhaust path corresponds to a first step of a film forming method recited in the claims.

Figure 5:
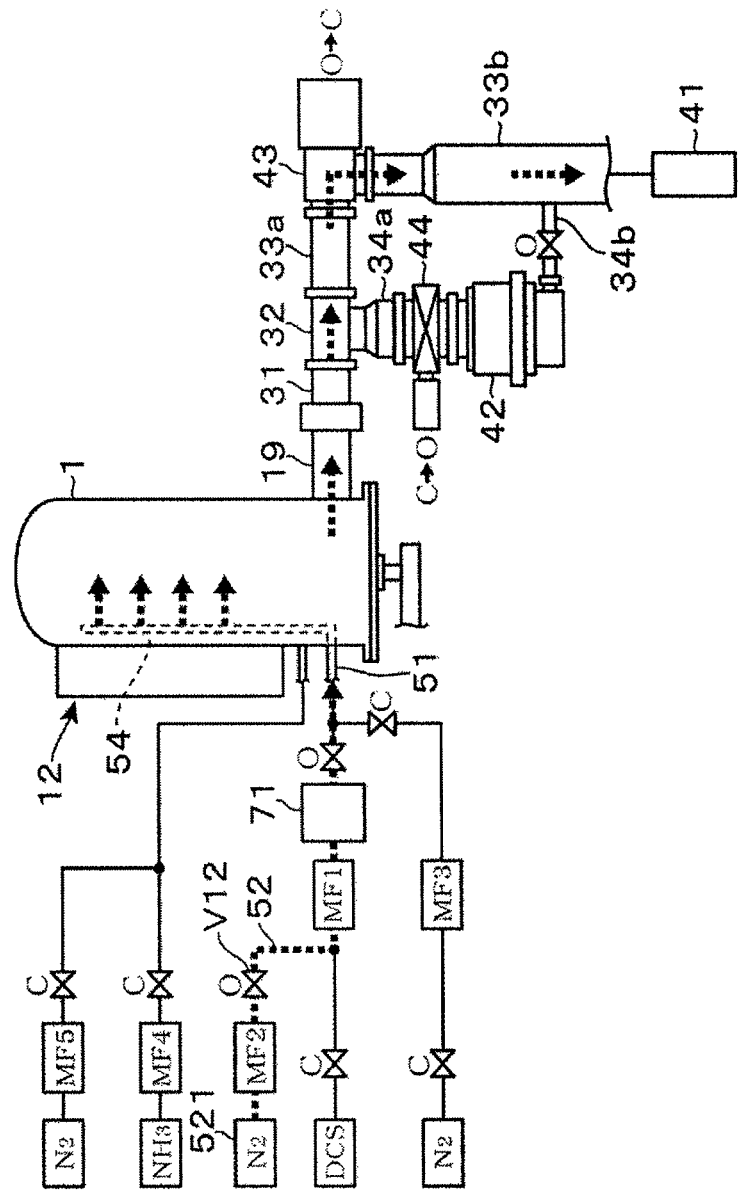
FIG. 5 is a third operation view of the film forming apparatus.

If the supply of the DCS gas is finished, the DCS gas remaining within the retaining tank 71, the DCS supply path 51 and the first gas nozzles 54 is purged (see FIG. 5). At this time, the supply amount of the nitrogen gas is made smaller than the amount of FIG. 3 which is available prior to the supply of the DCS gas, thereby keeping the internal pressure of the reaction vessel 1 at 13.3 Pa (0.1 Torr), i.e., a minimum pressure that can be obtained when the reaction vessel 1 is evacuated by the dry pump 41 at its full capacity. The gas flow indicated by a broken line in FIGS. 5 and 8 means that the gas supply amount is made smaller than the gas supply amount available in the previous step.

If the internal pressure of the reaction vessel 1 is stabilized in this manner, the first switching valve 43 in the "opened" state is closed (completely closed). At this time, the second switching valve 44 arranged at the side of the TMP 42 is kept in the "closed" state. In other words, the switching valves 43 and 44 existing in the two exhaust paths are simultaneously "closed". The switching valves 43 and 44 are kept "closed" for about 1 to 3 seconds. Then, the second switching valve 44 arranged at the side of the TMP 42 is "opened" and the gas existing within the reaction vessel 1 is exhausted toward the second exhaust path (the second exhaust pipe 34a, the TMP 42 and the second exhaust pipe 34b). In this case, the TMP 42 is operated in advance.

A manometer (not shown) is installed at the discharge side of the TMP 42. The opening operation of the second switching valve 44 is performed after confirming that the internal pressure of the second exhaust pipe 34b joined to the first exhaust pipe 33b is minimized by the dry pump 41. After the second switching valve 44 is opened, it is confirmed whether the indication of the manometer is increased and whether a gas flow is formed at the side of the second exhaust path.

As mentioned above, when switching the exhaust paths in which the dry pump 41 and the TMP 42 having different operation pressure zones are installed, the vacuum exhaust of the two exhaust paths are first stopped, thereby preventing the backflow of the gas from the first exhaust path having a relatively high pressure to the second exhaust path having a low pressure. This makes it possible to protect the TMP 42.

If the exhaust paths are switched, the internal pressure of the reaction vessel 1 is adjusted to a lower pressure under the control of the TMP 42. Thus, when the ammonia gas is supplied in the subsequent step, the internal pressure of the reaction vessel 1 is adjusted to become a target value.

Figure 6:
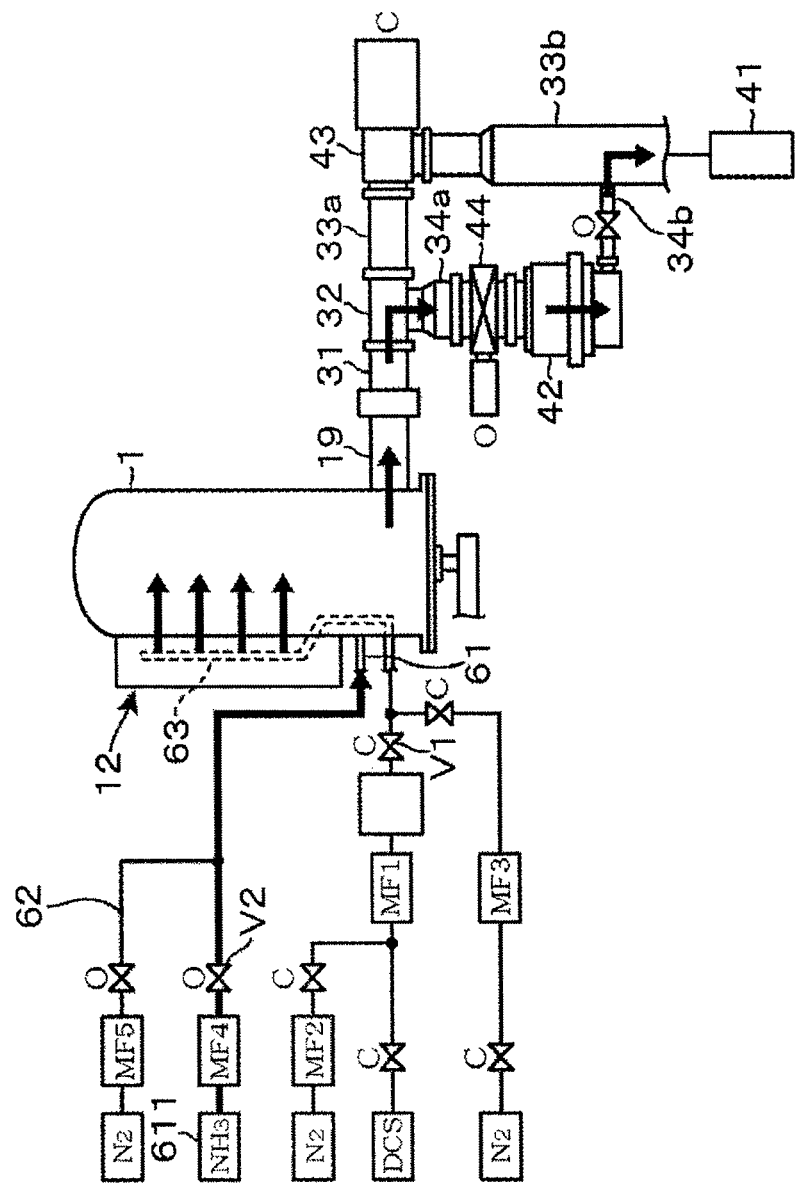
FIG. 6 is a fourth operation view of the film forming apparatus.
Figure 7:
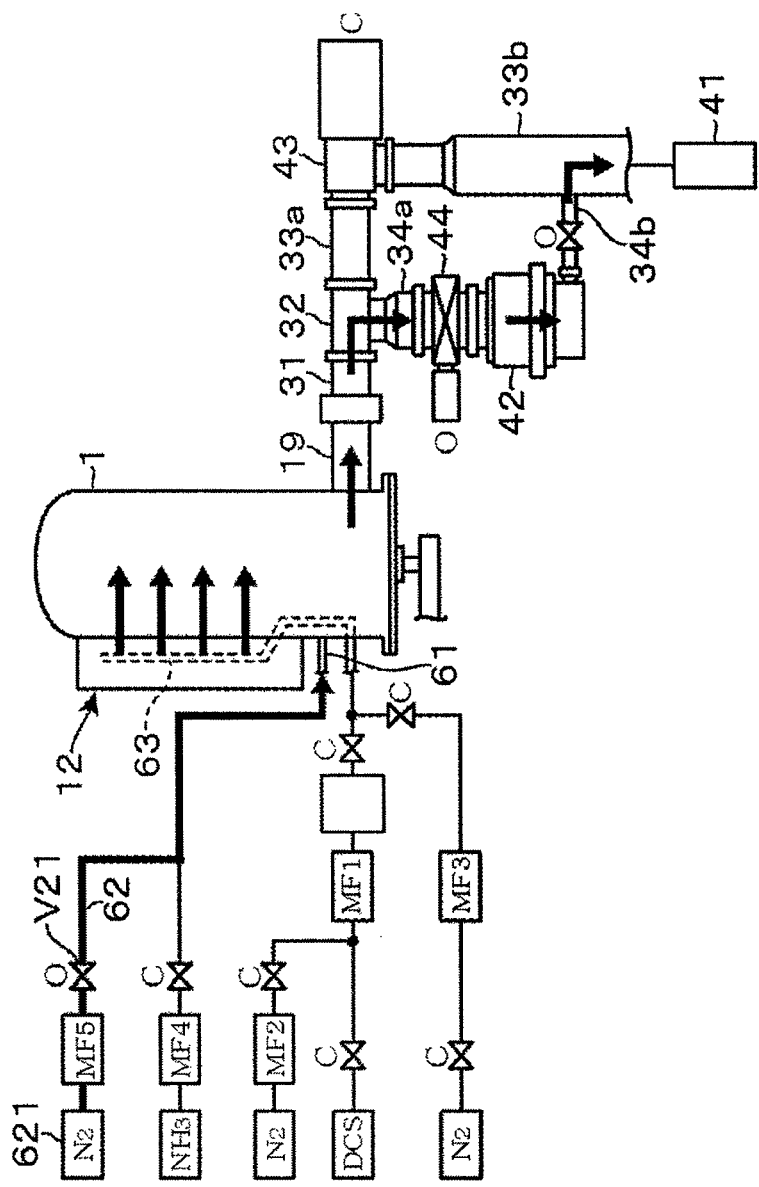
FIG. 7 is a fifth operation view of the film forming apparatus.
Figure 8:
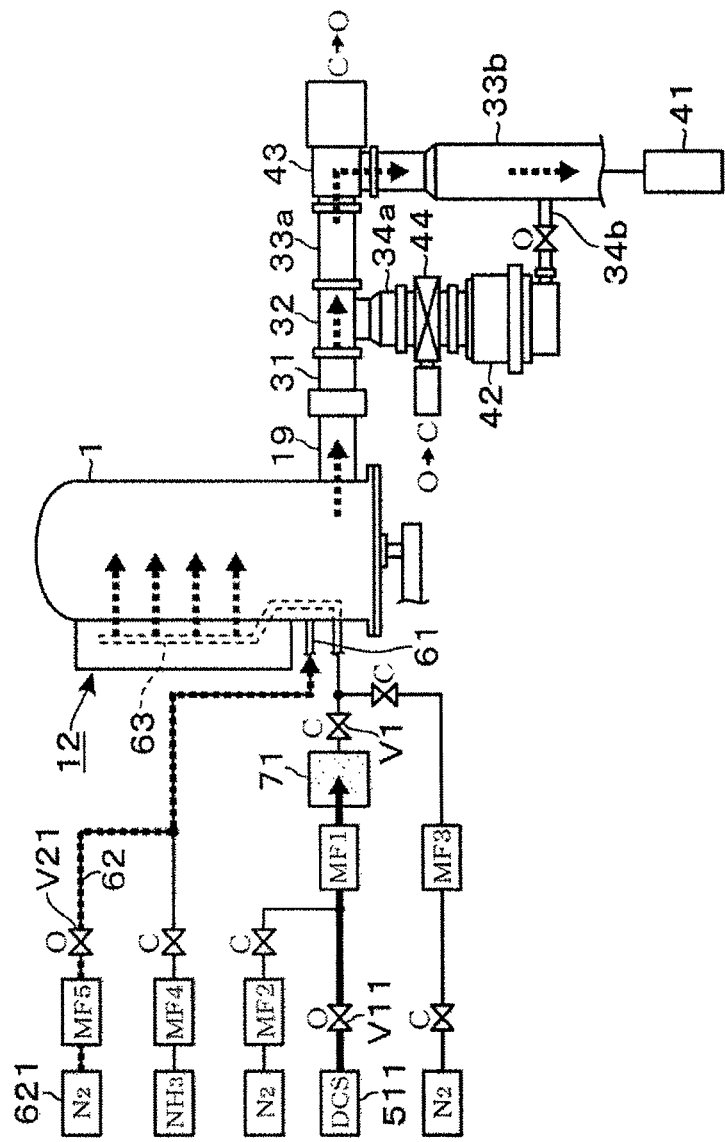
FIG. 8 is a sixth operation view of the film forming apparatus.

If the pressure adjustment is finished, an ammonia gas is supplied from the ammonia gas supply unit 611 to the second gas nozzle 63 through the ammonia supply path 61, e.g., at a flow rate of 5 slm which falls within a range of from 0.5 to 10.0 slm (see FIG. 6). At this time, a nitrogen gas as a carrier gas is supplied from the substituting gas supply path 62. During the supply of the ammonia gas, the internal pressure of the reaction vessel 1 is kept, e.g., at 6.7 Pa (0.05 Torr) which falls within a range of from 1.33 to 66.7 Pa (from 0.01 to 0.5 Torr).

If the high-frequency power supply 16 is turned on together with the supply of the ammonia gas, the ammonia gas is converted to plasma as designated by reference symbol PS in FIG. 2. Thus, active species such as N radicals, NH radicals, $NH_2$ radicals and $NH_3$ radicals are generated. These active species are introduced from the plasma generating unit 12 into the reaction vessel 1. While passing over the wafers W held in the rotating wafer boat 25 and heated by the heater 100, the active species react with the DCS attached to the surfaces of the wafers W, thereby forming a layer of SiN as a reaction product.

At this time, the exhaust path of the gas existing within the reaction vessel 1 is switched to the second exhaust path provided with the second vacuum exhaust mechanism (the TMP 42 and the dry pump 41) having a low operation pressure zone. Therefore, as compared with a case where vacuum exhaust is performed through the first exhaust path by the first vacuum exhaust mechanism (the dry pump 41 alone), it is possible to reduce the internal pressure of the reaction vessel 1.

As a result, the probability of collision of the active species is reduced and the deactivation associated with the collision is suppressed. This makes it possible to increase the amount of the active species that reach the central regions of the wafers W. If a sufficient amount of the active species is supplied to the central regions of the wafers W, it is possible to suppress generation of the regions where the generation amount of SiN is reduced due to the shortage of the active species. This makes it possible to uniformly generate the SiN layer within the planes of the wafers W. The step shown in FIG. 6, in which the ammonia gas (the first reaction gas) is supplied while performing the vacuum exhaust toward the second exhaust path, corresponds to a second step of the film forming method recited in the claims.

After performing the supply of the ammonia gas for a predetermined time, the supply of the ammonia gas is stopped and the high-frequency power supply 16 is turned off. A substituting nitrogen gas is supplied from the nitrogen gas supply source 621 to the second gas nozzle 63 (see FIG. 7).

Next, at the timing at which the ammonia gas existing in the reaction vessel 1 is sufficiently exhausted, the amount of the nitrogen gas supplied from the nitrogen gas supply source 621 is reduced and the internal pressure of the reaction vessel 1 is substantially minimized by the TMP 42 and the dry pump 41. Thereafter, the second switching valve 44 which previously have been kept "opened" is closed (The TMP 42 is continuously operated). At this time, the first switching valve 43 arranged at the side of the first exhaust pipes 33a and 33b is kept in a "closed" state. Thus, the switching valves 43 and 44 existing in the two exhaust paths are simultaneously "closed". The switching valves 43 and 44 are kept "closed" for about 1 to 3 seconds. Then, the first switching valve 43 arranged at the side of the first exhaust pipes 33a and 33b is "opened" and the gas existing within the reaction vessel 1 is exhausted toward the first exhaust path (the first exhaust pipes 33a and 33b) (see FIG. 8). During this switching operation, the vacuum exhaust of the two exhaust paths are first stopped, thereby preventing the backflow of the gas from the first exhaust path having a relatively high pressure to the second exhaust path having a low pressure. This makes it possible to protect the TMP 42.

In parallel with these operations, the DCS supply path 51 is disconnected from the first gas nozzles 54 and the DCS gas is supplied from the DCS supply unit 511 to the retaining tank 71. Thus, the retention of the DCS gas is started to prepare the next supply of the DCS gas. The operations described with reference to FIGS. 3 to 8 are repeated for, e.g., several ten times to several hundred times, thereby depositing layers of SiN and forming a SiN film having a desired thickness.

After performing the film forming process with respect to the wafers W, the internal temperature of the reaction vessel 1 is adjusted to a temperature suitable for carrying out the wafers W. Subsequently, a nitrogen gas is supplied from the nitrogen gas supply sources 531 and 621. Thereafter, the first and second switching valves 43 and 44 are completely closed and the internal pressure of the reaction vessel 1 is increased to the atmospheric pressure. Then, the wafer boat 25 is moved down and carried out from the reaction vessel 1. The film-formed wafers W are taken out from the wafer boat 25 and new wafers W are held in the wafer boat 25 to start the next film forming process.

The film forming apparatus according to the present embodiment provides the following effects. When performing the film forming process with respect to the wafers W within the reaction vessel 1 kept in a vacuum environment, the gas existing within the reaction vessel 1 is vacuum-exhausted toward different exhaust paths (toward the first exhaust pipes 33a and 33b as the first exhaust path or toward the second exhaust pipe 34a, the TMP 42 and the second exhaust pipe 34b as the second exhaust path) depending on the kinds of the reaction gases (the DCS gas and the ammonia gas) supplied into the reaction vessel 1. Since the vacuum exhaust mechanisms having different operation pressure zones (the dry pump 41 as the first vacuum exhaust mechanism and the TMP 42 and the dry pump 41 as the second vacuum exhaust mechanism) are connected to the respective exhaust paths, it is possible to appropriately change the internal pressure of the reaction vessel 1 depending on the kinds of the reaction gases.

As a result, in the film forming process of the present embodiment, when supplying the DCS gas which is to be supplied at a relatively high pressure, a vacuum exhaust process is performed through the first exhaust path in which the dry pump 41 having a relatively high operation pressure zone is installed. This enables the DCS to be efficiently attached to the surfaces of the wafers W within a short period of time. On the other hand, when supplying the ammonia gas, the vacuum exhaust process is performed through the second exhaust path in which the TMP 42 having a relatively low operation pressure zone and the dry pump 41 are installed. This makes it possible to prolong the lifespan of the active species and to realize uniformly formed films within the planes of the wafers W.

The purpose of changing the internal pressure of the reaction vessel 1 depending on the kinds of the source gases is not limited to the shortening of the time for the attachment of the raw materials to the wafers W or the prolonging of the lifespan of the active species but may be other purposes. Examples of other purposes include the adjustment of the reaction speed of the reaction gases, the high flow rate supply of the source gases, the high flow rate exhaust of the source gases and the adjustment of the film properties.

Examples of the vacuum exhaust mechanism, which is lower in the operation pressure zone than that of the dry pump 41, are not limited to the combined use of the TMP 42 and the dry pump 41 but may use, e.g., a cryopump. The method of changing the internal pressure of the reaction vessel 1 is not limited to the method of using different kinds of exhaust mechanisms such as the dry pump 41 and the TMP 42 but may be, e.g., a method in which dry pumps differing in ultimate pressure prescribed in the design specification are used as first and second vacuum exhaust mechanisms in different operation pressure zones.

In the example shown in FIG. 1 and other figures, the dry pump 41 is used as the first vacuum exhaust mechanism and the second vacuum exhaust mechanism is configured by combining the dry pump 41 and the TMP 42. However, the vacuum pump installed at the downstream side of the TMP 42 may not only be shared by the first vacuum exhaust mechanism but also may be a dedicated vacuum pump installed independently.

The first exhaust path and the second exhaust path may not only be connected to the reaction vessel 1 through the common exhaust port 19 but also may be independently connected to the reaction vessel 1.

The film forming apparatus of the present disclosure may not only form the aforementioned SiN film but also may form a film which contains a metal element or a metalloid element (hereinafter, for the sake of convenience in description, the metal and the metalloid will be collectively referred to as a "metal"), e.g., a period 3 element of the periodic table such as Al or the like, a period 4 element of the periodic table such as Ti, Cr, Mn, Fe, Co, Ni, Cu, Zn, Ge or the like, a period 5 element of the periodic table such as Zr, Mo, Ru, Rh, Pd, Ag or the like, or a period 6 element of the periodic table such as Ba, Hf, Ta, W, Re, Ir, Pt or the like. As the metallic material to be attached to the surfaces of the wafers W, it may be possible to use a reaction gas (a source gas) containing an organic metal compound or an inorganic metal compound of the aforementioned metal element. Specific examples of the metallic material include not only the DCS mentioned above but also BTBAS (bis(tertiary-butyl amino) silane, $TiCl_4$ (titanium tetrachloride), HCD (hexadichlorosilane), TMA (trimethylaluminum), 3DMAS (trisdimethylaminosilane) and DIPAS (diisopropylaminosilane).

As the reaction in which a desired film is obtained by reacting the source gas attached to the surfaces of the wafers W, it may be possible to use various kinds of reactions, e.g., an oxidation reaction which makes use of O radicals generated by the reaction of $O_2$, $O_3$, $H_2O$, $H_2$ with $O_2$, a reduction reaction which makes use of an organic acid such as HCOOH, $CH_3COOH$ or the like, an alcohol such as $CH_3OH$, $C_2H_5OH$ or the like, or $H_2$, a carbonization reaction which makes use of $CH_4$, $C_2H_6$, $C_2H_4$, $C_2H_2$ or the like, and a nitriding reaction which makes use of $NH_3$, $NH_2NH_2$, $N_2$ or the like.

In case where the reaction gases are supplied to the wafers W in the form of active species, the gas activation unit is not limited to the unit that obtains active species by converting the reaction gases to plasma. As an alternative example, active species may be generated by heating the reaction gases or may be generated by irradiating energy rays such as ultraviolet rays or X-rays on the reaction gases.

As the reaction gases, it may be possible to use three kinds of reaction gases or four kinds of reaction gases. For example, three kinds of reaction gases are used in forming a strontium titanate ($SrTiO_3$) film. Examples of the three kinds of reaction gases used at this time include $Sr(THD)_2$ (strontium bistetramethylheptanedionate) as a Sr raw material, $Ti(OiPr)_2(THD)_2$ (titanium bisisopropoxide bistetramethylheptanedionate) as a Ti raw material, and an ozone gas as an oxide gas thereof. In this case, the reaction gases are switched in the order of a Sr source gas, a substituting gas, an oxidizing gas, a substituting gas, a Ti source gas, a substituting gas, an oxidizing gas and a substituting gas. Paying attention to at least two kinds of reaction gases contained in three or more kinds of reaction gases, the exhaust of one of the reaction gases through the first exhaust path provided with the first vacuum exhaust mechanism and the exhaust of the other reaction gas through the second exhaust path provided with the second vacuum exhaust mechanism lower in operation pressure zone than the first vacuum exhaust mechanism are included in the technical scope of the present disclosure.

In addition, the film forming apparatus according to the present disclosure is not limited to the batch-type film forming apparatus which performs a film forming process with respect to a plurality of wafers W held in the wafer boat 25 but may be, e.g., a single-wafer-type film forming apparatus which performs a film forming process by sequentially supplying reaction gases to a single wafer W placed on a mounting table arranged within a processing vessel. Moreover, the present disclosure is not limited to an ALD film forming method but may be applied to a CVD (Chemical Vapor Deposition) method in which the film forming process is performed by alternately supplying different reaction gases onto a wafer W.

Examples

In the formation of a SiN film using a DCS gas and an ammonia gas as reaction gases, the influence of the internal pressure of the reaction vessel 1 during the supply of the ammonia gas was studied.

(Test 1)

A. Test Conditions

Figure 9A:
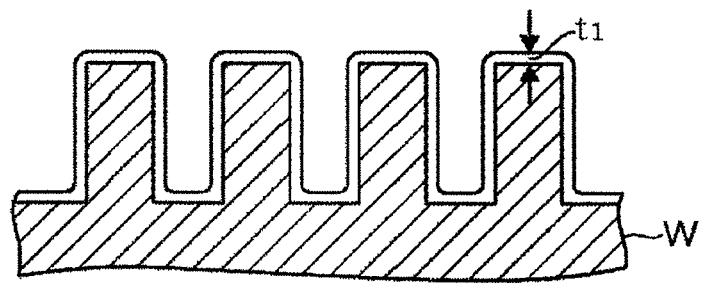
FIGS. 9A, 9B and 9C are explanatory views showing a configuration of a wafer used in a test.
Figure 9B:
Figure 9C:
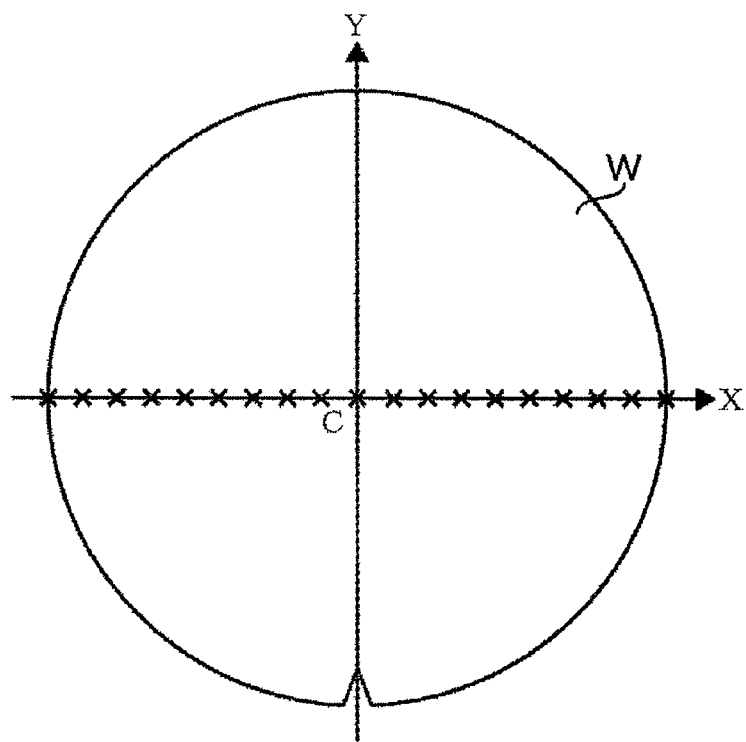

The influence on the in-plane thickness uniformity of a SiN film was studied by changing the internal pressure of the reaction vessel 1 during the supply of the ammonia gas. In the respective tests, a film forming process was performed with respect to three kinds of wafers (300 mm in diameter), namely a wafer having a trench pattern shown in FIG. 9A (a wafer having a surface area three times larger than that of a wafer having no trench pattern and a wafer having a surface area five times larger than that of a wafer having no trench pattern) and a wafer having no trench pattern shown in FIG. 9B. 100 sheets of wafers W were carried into the reaction vessel 1. A DCS gas was supplied from the retaining tank 71 under the same conditions as described with reference to FIG. 4 and an ammonia gas was supplied at 5 slm for 20 seconds. The reaction temperature was 500 degrees C. and the electric power applied from the high-frequency power supply 16 was 13.56 MHz and 100 W. The supply cycle of the DCS gas and the ammonia gas was performed 300 times. As shown in FIG. 9C, after performing the film forming process, the radial film thickness distributions of the SiN films formed on the surfaces of the wafers W were measured by a film thickness measuring instrument.

(Test Condition 1-1)
Internal pressure (total pressure) of the processing vessel P=12.0 [Pa] (0.09 [Torr])
(Test Condition 1-2)
Internal pressure of the processing vessel P=16.0 [Pa] (0.12 [Torr])
(Test Condition 1-3)
Internal pressure of the processing vessel P=25.7 [Pa] (0.19 [Torr])
(Test Condition 1-4)
Internal pressure of the processing vessel P=38.3 [Pa] (0.29 [Torr])
(Test Condition 1-5)
Internal pressure of the processing vessel P=62.3 [Pa] (0.47 [Torr])

B. Test Results

Figure 10:
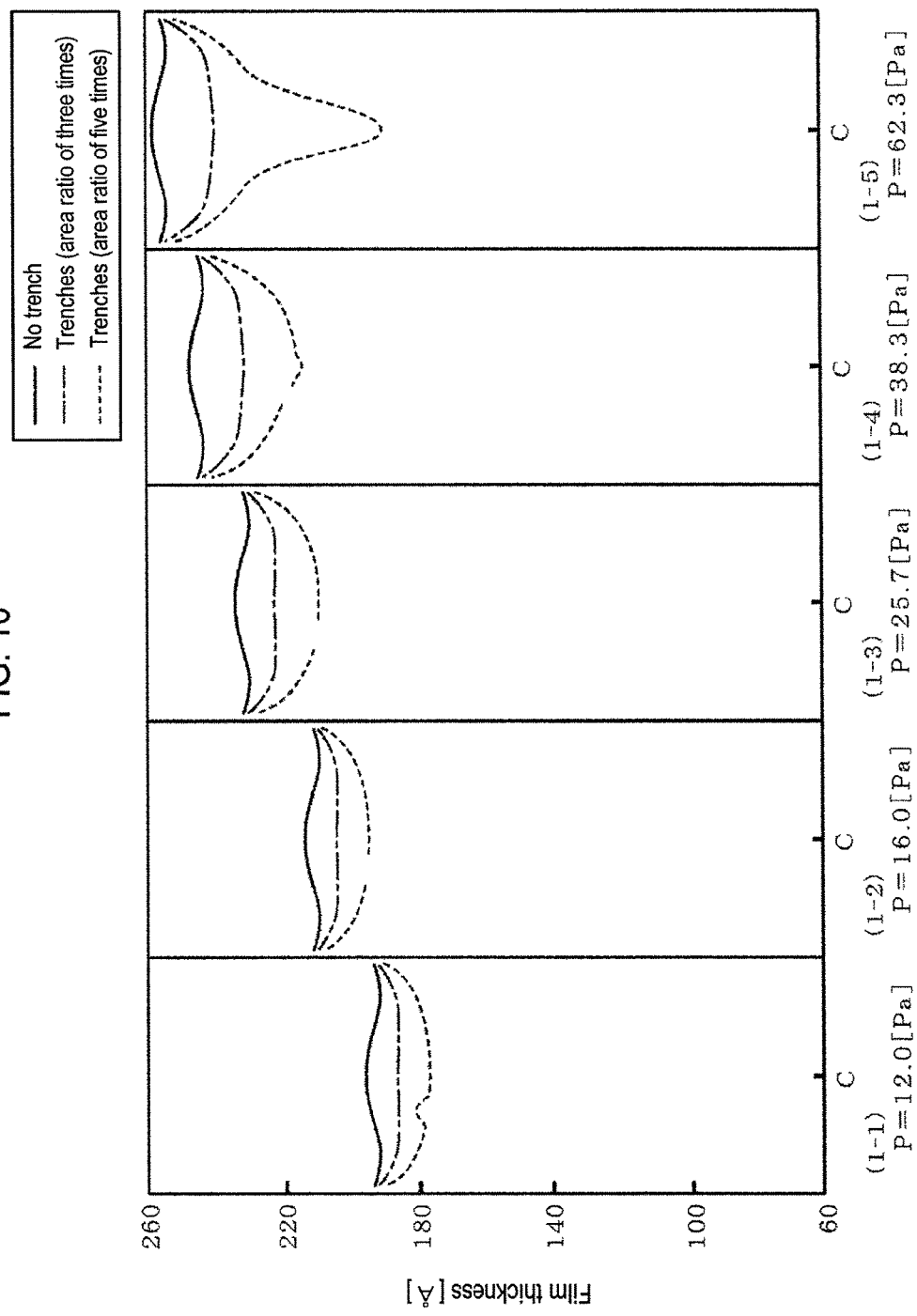
FIG. 10 is an explanatory view representing the relationship between the internal pressure of the reaction vessel and the film thickness distribution.

FIG. 10 shows the displacements of film thickness distributions of three kinds of wafers W under the respective test conditions. In the respective graphs, the horizontal axis indicates the radial position of the wafer W and the vertical axis indicates the thickness of the SiN film. The solid line indicates the thickness distribution of the SiN film in the wafer W having no trench. The single-dot chain line indicates the thickness distribution of the SiN film in the wafer W having trenches (with an area ratio of three times). The broken line indicates the thickness distribution of the SiN film in the wafer W having trenches (with an area ratio of five times).

Figure 11:
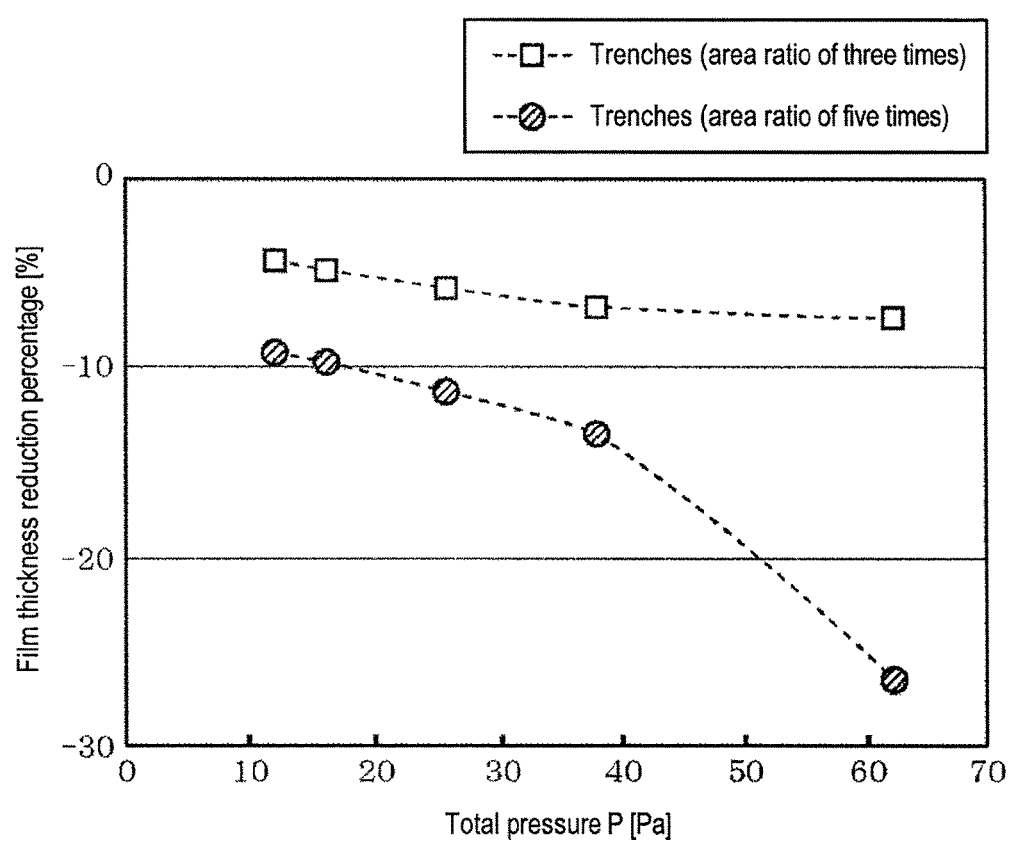
FIG. 11 is an explanatory view representing the relationship between the internal pressure of the reaction vessel and the film thickness reduction percentage.

FIG. 11 shows the plotting results in which the film thickness reduction percentage of the wafer W having trenches to the wafer W having no trench in the central position of the wafer W is plotted with respect to the internal pressure of the reaction vessel 1 during the supply of the ammonia gas. As shown in FIGS. 9A and 9B, the thickness of the SiN film formed on the upper surface of the wafer W having trenches is assumed to be t1 and the thickness of the SiN film formed on the upper surface of the wafer W having no trench is assumed to be t2. At this time, the film thickness reduction percentage was calculated by an equation $\{(t1-t2)/t1\} \times 100$ [%]. In FIG. 11, the film thickness reduction percentage in the wafer W having an area ratio of three times is plotted with void squares and the film thickness reduction percentage in the wafer W having an area ratio of five times is plotted with black circles.

According to the results shown in FIGS. 10 and 11, in any of the test conditions of 1-1 to 1-5, the film thickness of the SiN film in the central region of the wafer W having trenches is smaller than that of the wafer W having no trench. Comparing the wafers W having trenches with each other, the film thickness decline amount (the film thickness reduction percentage) in the central region of the wafer W with a large area ratio (with a large number of trenches) is larger than that of the wafer W with a small area ratio (with a small number of trenches).

In the wafer W having no trench, a relatively uniform film thickness distribution is obtained. It is therefore possible to know that the cause of generation of the aforementioned film thickness distribution is not attributable to the shortage of the attachment amount of the DCS. Accordingly, in the wafer W having trenches, active species are first consumed in the peripheral edge portion of the wafer W. As a result, it is considered that the thickness of the SiN film in the central region is reduced due to the lower amount of the active species of the ammonia gas supplied to the central region.

Referring to FIG. 11, it can be noted that the film thickness reduction percentage in the central region of the wafer W becomes smaller as the internal pressure of the reaction vessel 1 during the supply of the ammonia gas is lowered. In the respective test results shown in FIG. 10, it can be confirmed that, as the internal pressure of the reaction vessel 1 becomes lower, the film thickness distribution of the wafer W having trenches comes closer to the film thickness distribution of the wafer W having no trench. Thus, if the internal pressure of the reaction vessel 1 is reduced during the supply of the ammonia gas, the lifespan of the active species becomes longer and the active species can reach the central region of the wafer W. This makes it possible to increase the amount of the SiN generated in the central region of the wafer W and to enhance the in-plane uniformity of the film thickness distribution.

Therefore, in the process of forming a SiN film with the DCS gas (the first reaction gas) and the ammonia gas (the second reaction gas), it was possible to confirm that the degree of acceleration of reaction when the ammonia gas is supplied after the DCS gas is attached to the wafer W becomes larger in the environment of the second pressure during the supply of the ammonia gas than in the environment of the first pressure during the supply of the DCS gas.

It was also possible to know that the lifespan of the active species of the ammonia gas becomes longer in the environment of the second pressure than in the environment of the first pressure.

(Test 2)

The internal pressure of the reaction vessel 1 (the second pressure) during the supply of the ammonia gas was kept constant at 40 Pa (0.3 Torr) and the partial pressure ($P_{NH3}$) of the ammonia gas was changed by adjusting the supply amounts of the ammonia gas and the nitrogen gas supplied into the reaction vessel 1 during the supply of the ammonia gas. Other conditions were kept identical with the conditions of (Test 1). Thus, the influence on the thickness distribution of the SiN film was studied.

A. Test Conditions (Test Condition 2-1)

Partial Pressure of the ammonia gas $P_{NH3}$=6.4 [Pa] (0.048 [Torr])

(Test Condition 2-2)

Partial Pressure of the ammonia gas $P_{NH3}$=18.3 [Pa] (0.13 [Torr])

(Test Condition 2-3)

Partial Pressure of the ammonia gas $P_{NH3}$=28.5 [Pa] (0.21 [Torr])

(Test Condition 2-4)

Partial Pressure of the ammonia gas $P_{NH3}$=32.0 [Pa] (0.24 [Torr])

B. Test Results

Figure 12:
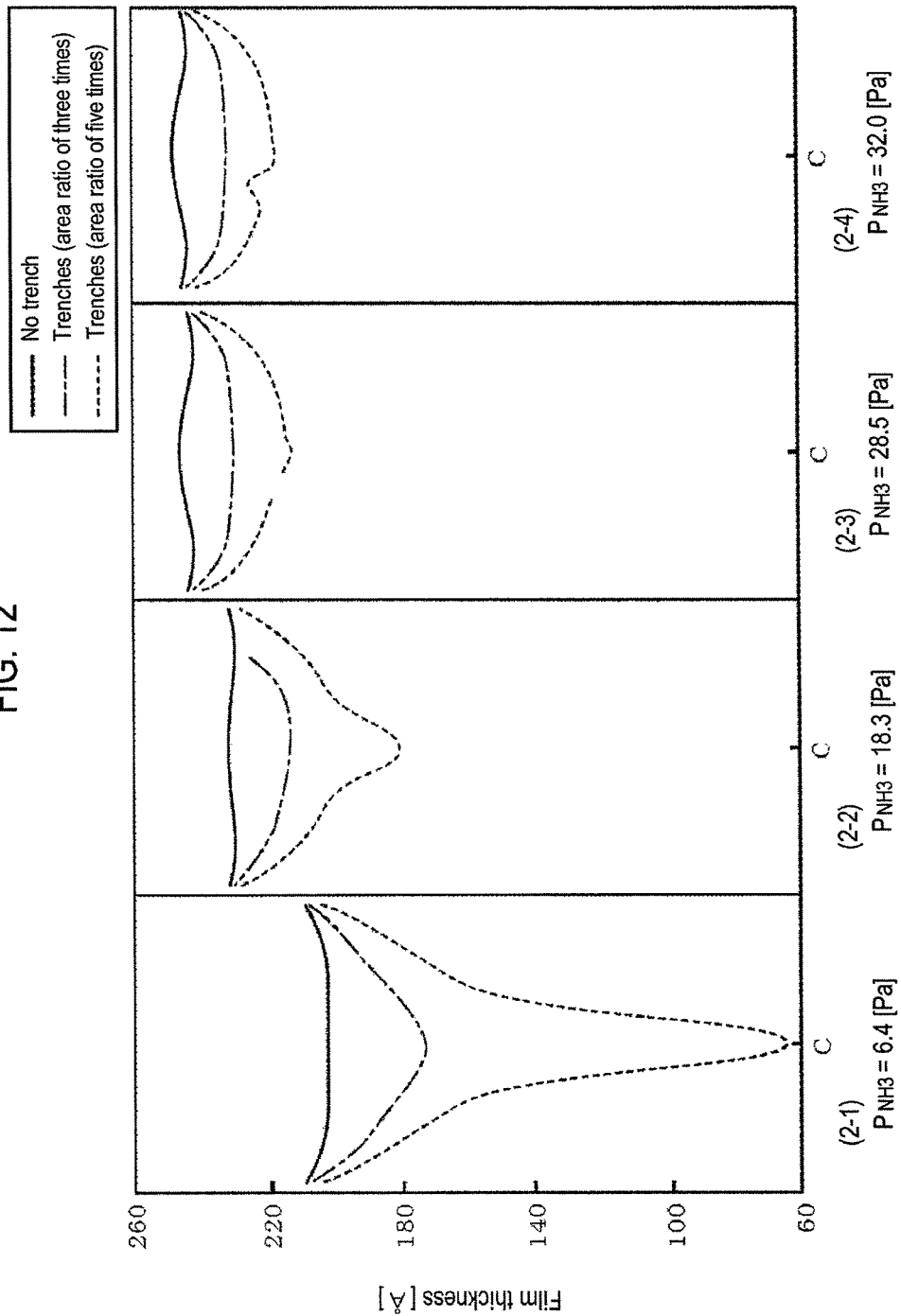
FIG. 12 is an explanatory view representing the relationship between the partial pressure of an ammonia gas and the film thickness distribution.
Figure 13:
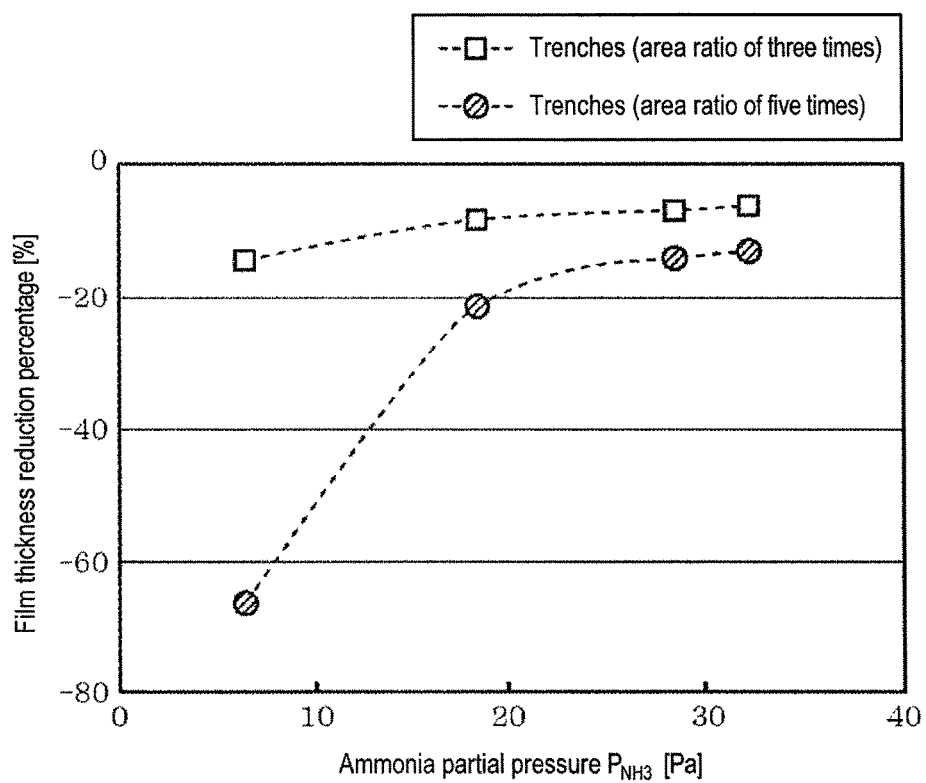
FIG. 13 is an explanatory view representing the relationship between the partial pressure of an ammonia gas and the film thickness reduction percentage.

FIG. 12 shows the displacements of film thickness distributions of three kinds of wafers W under the respective test conditions. FIG. 13 shows the plotting results in which the film thickness reduction percentage of the wafer W having trenches to the wafer W having no trench in the central position of the wafer W is plotted with respect to the partial pressure of the ammonia gas. The vertical axis, the horizontal axis, the kinds of lines and the plotting are respectively identical with those shown in FIGS. 10 and 11.

In the results of (Test 1) shown in FIG. 10, it was confirmed that the average in-plane thickness of the SiN film formed on the wafer W tends to become smaller as the internal pressure of the reaction vessel 1 (the second pressure) is lowered. Therefore, if the partial pressure of the ammonia gas supplied into the reaction vessel 1 is increased, it becomes possible to increase the film thickness and to improve the film thickness distribution. From these results, it is possible to know that, when the internal pressure of the reaction vessel 1 (the second pressure) is reduced for the sake of improving the film thickness distribution, the reduction of the film forming speed can be supplemented if the supply amount of the nitrogen gas supplied into the reaction vessel 1 for the purpose of preventing the backflow of the ammonia gas to the first gas nozzles 54 for the DCS gas and the cleaning gas nozzle (not shown) or the supply amount of the nitrogen gas supplied as the carrier gas of the ammonia gas from the substituting gas supply path 62 is reduced to a necessary minimum limit to increase the partial pressure of the ammonia gas.

According to the present disclosure, when performing the film forming process on the substrate within the processing vessel kept in a vacuum environment, the vacuum exhaust of the interior of the reaction vessel is performed toward different exhaust paths (the first exhaust path and the second exhaust path) depending on the kinds of the reaction gases supplied into the processing vessel. The vacuum exhaust mechanisms (the first vacuum exhaust mechanism and the second vacuum exhaust mechanism) differing in the operation pressure zone from each other are connected to the respective exhaust paths. This makes it possible to appropriately change the internal pressure of the reaction vessel depending on the kinds of the reaction gases.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus configured to perform a film forming process on a substrate in a vacuum environment by sequentially supplying different kinds of mutually-reacting reaction gases into a reaction vessel, comprising:
   a first reaction gas supply unit configured to supply a first reaction gas into the reaction vessel;
   a second reaction gas supply unit configured to supply a second reaction gas into the reaction vessel;
   a common exhaust pipe connected to the reaction vessel;
   first and second exhaust paths branched off from the common exhaust pipe, the second exhaust path being joined to the first exhaust path at a joining position in the first exhaust path;
   first and second switch valves installed in the first and second exhaust paths, respectively, the first switch valve being installed at an upstream side of the joining position;
   a vacuum pump installed at a downstream side of the joining position and connected to the reaction vessel through the common exhaust pipe and the first exhaust path;
   a turbo molecular pump installed at a downstream side of the second switch valve in the second exhaust path and connected to the reaction vessel through the common exhaust pipe and the second exhaust path, the turbo molecular pump being lower in an operation pressure zone than the vacuum pump; and
   a control unit configured to switch exhaust destinations of the reaction vessel between the first exhaust path and the second exhaust path based on a kind of reaction gas supplied into the reaction vessel,
   wherein the control unit opens the first switch valve and closes the second switch valve such that gas discharge from the reaction vessel is performed by the vacuum pump through the first exhaust path to create an environment of a first pressure within the reaction vessel while the first reaction gas is supplied into the reaction vessel from the first reaction gas supply unit, and
   wherein the control unit opens the second switch valve and closes the first switch valve such that gas discharge from the reaction vessel is performed by the turbo molecular pump and the vacuum pump through the second exhaust path and a portion of the first exhaust path at the downstream side of the joining position to create an environment of a second pressure lower than the first pressure within the reaction vessel while the second reaction gas is supplied into the reaction vessel from the second reaction gas supply unit, the second pressure falling within a range from 1.33 Pa to 12 Pa.

2. The film forming apparatus of claim 1, wherein the degree of acceleration of reaction when supplying the second reaction gas after the first reaction gas is attached to the substrate is higher in the environment of the second pressure than in the environment of the first pressure.

3. The film forming apparatus of claim 1, further comprising:
a gas activation unit configured to activate the second reaction gas, wherein the lifespan of active species obtained by the activation of the second reaction gas is longer in the environment of the second pressure than in the environment of the first pressure.

4. The film forming apparatus of claim 3, wherein the gas activation unit is further configured to obtain the active species by converting the second reaction gas to plasma.

5. The film forming apparatus of claim 1, further comprising:
a substrate holding unit configured to hold a plurality of substrates in a shelf-like shape, wherein the film forming process is performed by carrying the substrate holding unit, which holds the plurality of substrates to be processed, into the reaction vessel.

6. A film forming method for performing a film forming process on a substrate in a vacuum environment by sequentially supplying different kinds of mutually-reacting reaction gases into a reaction vessel, comprising:
a first process in which a first reaction gas is supplied into the reaction vessel under an environment of a first pressure and in which the interior of the reaction vessel is evacuated by a first vacuum exhaust mechanism connected to the reaction vessel through a first exhaust path in order to create the environment of the first pressure within the reaction vessel; and
a second process in which a second reaction gas is supplied into the reaction vessel under an environment of a second pressure lower than the first pressure and in which the interior of the reaction vessel is evacuated by a second vacuum exhaust mechanism connected to the reaction vessel through a second exhaust path and lower in an operation pressure zone than the first vacuum exhaust mechanism in order to create the environment of the second pressure within the reaction vessel,
wherein the first process and the second process are repeatedly performed.

7. The method of claim 6, wherein the degree of acceleration of reaction when supplying the second reaction gas after the first reaction gas is attached to the substrate is higher in the environment of the second pressure than in the environment of the first pressure.

8. The method of claim 6, further comprising:
an activating process for activating the second reaction gas, and wherein the lifespan of active species obtained by the activation of the second reaction gas is longer in the environment of the second pressure than in the environment of the first pressure.

9. The method of claim 8, wherein, in the activating process, the active species are obtained by converting the second reaction gas to plasma.

10. A non-transitory computer-readable storage medium for storing a computer program used in a film forming apparatus configured to perform a film forming process on a substrate in a vacuum environment by sequentially supplying different kinds of mutually-reacting reaction gases into a reaction vessel, the computer program incorporating a process group for implementing the film forming method of claim 6.

11. The film forming apparatus of claim 1, wherein the control unit is configured to keep both of the first switch valve and the second switch valve in a closed state for one to three seconds when switching the exhaust destinations between the first exhaust path and the second exhaust path.

* * * * *